United States Patent
Watt (10) Patent No.: US 6,586,296 B1
(45) Date of Patent: Jul. 1, 2003

(54) METHOD OF DOPING WELLS, CHANNELS, AND GATES OF DUAL GATE CMOS TECHNOLOGY WITH REDUCED NUMBER OF MASKS

(75) Inventor: Jeffrey T. Watt, Palo Alto, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/846,666

(22) Filed: Apr. 30, 2001

(51) Int. Cl.$^7$ ............................................. H01L 21/8238
(52) U.S. Cl. ......................... 438/224; 438/419; 438/532
(58) Field of Search ................................ 438/199, 223, 438/224, 419, 420, 514, 517, 527, 945, 532

(56) References Cited

U.S. PATENT DOCUMENTS

| | | |
|---|---|---|
| 4,929,565 A | 5/1990 | Parrillo |
| 5,134,085 A | 7/1992 | Gilgen et al. |
| 5,252,501 A * | 10/1993 | Moslehi |
| 5,278,085 A | 1/1994 | Maddox, III et al. |
| 5,374,566 A | 12/1994 | Iranmanesh |
| 5,474,946 A | 12/1995 | Ajit et al. |
| 5,571,738 A | 11/1996 | Krivokapic |
| 5,750,424 A * | 5/1998 | Choi et al. |
| 5,783,474 A | 7/1998 | Ajit |
| 5,795,801 A | 8/1998 | Lee |
| 5,837,553 A | 11/1998 | Pearce |
| 5,929,493 A | 7/1999 | Wu |
| 5,940,689 A | 8/1999 | Rexer et al. |
| 5,985,743 A * | 11/1999 | Gardner |
| 6,156,591 A | 12/2000 | Wu |
| 6,207,538 B1 * | 3/2001 | Pan et al. |
| 6,417,038 B1 * | 7/2002 | Noda |

OTHER PUBLICATIONS

Eguchi et al., "New Dual Doping Process using In–situ Boron Doped–Si for Deep Sub–$\mu$m CMOS Device," © 1993 IEEE, pp. 34.1.1–34.1.4.

* cited by examiner

Primary Examiner—Chandra Chaudhari
(74) Attorney, Agent, or Firm—Kevin L. Daffer; Conley, Rose P.C.

(57) ABSTRACT

A method is provided for processing a semiconductor topography. In particular, a method is provided for forming wells of opposite conductivity type using a single patterned layer. In addition, the method may include forming a silicon layer having first and second portions of opposite conductivity type. The formation of the silicon layer may include the use of the single patterned layer or an additional patterned layer. In addition, the method may include forming channel dopant regions within the wells of opposite conductivity type. The formation of such channel dopant regions may be incorporated into the method using the one or two patterned layers used for the formation of the wells and doped silicon layer. Such a method may include introducing impurities at varying energies and doses to compensate for the introduction of subsequent impurities. As such, the method may form a dual gate transistor pair, including n-channel and p-channel transistors.

20 Claims, 7 Drawing Sheets

METHOD OF DOPING WELLS, CHANNELS, AND GATES OF DUAL GATE CMOS TECHNOLOGY WITH REDUCED NUMBER OF MASKS

BACKGROUND OF THE INVENTION

1. Field of the Invention

This invention relates to semiconductor device manufacturing, and more particularly, to an improved method for processing a semiconductor substrate.

2. Description of the Related Art

The following descriptions and examples are not admitted to be prior art by virtue of their inclusion within this section.

In the fabrication of metal-oxide-semiconductor ("MOS") transistors, a gate conductor may be arranged upon a gate dielectric, which may be formed upon a substrate. Typically, the gate dielectric is laterally interposed between source and drain regions formed in the substrate, where the source and drain regions may be doped to opposite conductivity type (either n-type or p-type) than the substrate. N-type source/drain regions may be used to form n-channel transistors, and p-type source/drain regions may be used to form p-channel transistors. However, in complementary MOS ("CMOS") circuits, both n-channel and p-channel transistors are employed within the same substrate. Consequently, "wells" may be formed by selectively doping the region of the substrate underlying the subsequently formed gate conductors, thereby allowing a substrate of either conductivity type to be used. The wells are doped with an opposite conductivity type than that of the source and drain regions. In this manner, n-channel transistors may be formed in p-type wells, while p-channel transistors may be formed in n-type wells.

In some embodiments, a single n-type doped polysilicon gate material is used for the formation of the gate conductors of the NMOS and PMOS transistors. Due to the work function of the n-type polysilicon, a p-type threshold adjust implant is required for the formation of the PMOS transistor. As such, a surface channel NMOS transistor and a buried channel PMOS transistor is produced. Unfortunately, the buried channel PMOS transistor has poor short channel characteristics and, as a result, must be designed with a larger threshold voltage than the surface channel NMOS transistor to limit subthreshold leakage current. However, high threshold voltages may have a significant effect on performance of the circuit, particularly at low supply voltages.

An alternative approach to the single poly method is the formation of gate structures having opposite conductivity type. Such a method may be referred to as the "dual poly" or "dual gate" approach and includes an n-type doped polysilicon gate for the NMOS transistor and a p-type doped polysilicon gate for the PMOS transistor. Such a method produces a surface channel NMOS transistor and a surface channel PMOS transistor, thereby allowing the threshold voltage of the PMOS transistor to be approximately the same value as the NMOS transistor. Unfortunately, such a process is very costly to integrate into the fabrication of CMOS circuits due to the high number of masks which may be required to implant the wells and gate conductors. For instance, at least four patterned masking layers are typically needed for the doping of wells, channel dopant regions, and gates of a dual gate CMOS circuit using the "dual poly" method. Two masking layers are for the formation of wells and/or channel dopant regions of opposite conductivity type within the substrate and an additional two masking layers are for the formation of gate structures of opposite conductivity type overlying the wells. The high number of masks undesirably increases the processing costs and time of fabricating the circuit.

In some embodiments, source/drain regions may be doped simultaneously with the gate structures. However, in some cases, the gate structures of a CMOS circuit may be doped with impurities before the formation of the source/drain regions, thereby requiring additional masking layers. For example, the formation of a dual gate transistor pair in a memory circuit may require additional masking layers since source/drain regions may not be formed in conjunction with the doping of the gate structures. In such a circuit formation, gate structures may include an insulating cap above the gate electrode for subsequent formation of self-aligned contact schemes. In such an instance, an insulating layer may be formed upon a silicon layer prior to the patterning of the gate structures. As such, the silicon layer must be doped prior to the formation of the insulating layer. Masking steps are therefore needed in this case to form oppositely-doped gates in a dual poly approach, since the gates cannot be doped along with the subsequently formed source/drain regions.

Accordingly, it would be advantageous to develop a method for forming a CMOS integrated circuit, in which the NMOS transistor and PMOS transistor may have comparable threshold voltages. In particular, it would advantageous to form such an integrated circuit using fewer masking layers.

SUMMARY OF THE INVENTION

The problems outlined above may be in large part addressed by a method for processing a semiconductor substrate. In particular, a method is provided for forming first and second wells of opposite conductivity type using a single patterned layer. In addition, the method may include forming a silicon layer having first and second portions of opposite conductivity type. The formation of the silicon layer may include the use of the single patterned layer or an additional patterned layer. The method as described herein may form a dual gate transistor pair, which includes a first well doped with well impurities of both conductivity types. More specifically, the first well may include a greater concentration of a well impurity of one conductivity type than a concentration of a well impurity of the other conductivity type. The dual gate transistor pair may include a second well doped with the well impurity of the lower concentration. A first gate structure doped with both conductivity types may be arranged upon one of the first and second wells, where the first gate structure has a greater concentration of gate impurities of one conductivity type than a concentration of the other conductivity type. In addition, a second gate structure doped with the gate impurity of the lower concentration may be arranged upon the other of the wells.

As stated above, the method includes forming first and second wells of opposite conductivity type using a single patterned layer. Such a method may include forming the single patterned layer over a portion of the semiconductor substrate and subsequently introducing first well dopants into the patterned layer and into exposed portions of the semiconductor substrate. The single patterned layer may then be removed so that second well dopants of opposite conductivity type may be introduced into the semiconductor substrate without the single patterned layer. Introducing the first and second well dopants may include forming respective first and second well dopant concentrations, where the first well dopant concentration may be higher than the second well dopant concentration. In a further embodiment, introducing first and second well dopants may include implanting such that a dose of the first well dopants is larger than a dose of the second well dopants. For example, the dose of the first well dopants may be up to approximately 5.0 times larger than the dose of second well dopants. More specifically, the dose of the first well dopants may be approximately 1.5 times to approximately 3.0 times larger than the dose of the second well dopants.

The method may further include forming a silicon layer having first and second portions of opposite conductivity type above the semiconductor substrate. In an embodiment, each of the first and second portions of the silicon layer may be arranged above one of the first and second wells. In addition, each of the portions may have an opposite conductivity type to the respective underlying well. Furthermore, the silicon layer may be patterned to form a gate structure above each of the first and second wells. In some embodiments, the silicon layer may be formed using an additional single patterned layer. For example, a silicon layer, which includes dopants of one conductivity type, may be deposited over the semiconductor substrate. An additional single patterned layer may be formed over a region of the silicon layer and gate dopants may be subsequently introduced into the additional single patterned layer and exposed portions of the silicon layer. Preferably, the gate dopants in such an embodiment are of opposite conductivity type to the conductivity type of the deposited silicon layer. In an alternative embodiment, the silicon layer may be formed by first depositing an undoped silicon layer over the semiconductor substrate. An additional single patterned layer may be formed over a region of the silicon layer and first gate dopants may be introduced into the additional single patterned layer and exposed portions of the silicon layer. The additional single patterned layer may then be removed so that second gate dopants may be introduced into the silicon layer without the additional single patterned layer. Preferably, the second gate dopants are of opposite conductivity type to the first gate dopants. Similar to the formation of the first and second well concentrations within the semiconductor substrate, introducing first and second gate dopants may form respective first and second gate dopant concentrations within the silicon layer. In one embodiment, the first gate dopant concentration may be higher than the second gate dopant concentration.

The method as described herein may further include introducing channel dopants into the semiconductor substrate. For example, first channel dopants may be introduced into the exposed portion of the semiconductor substrate prior to removing the single patterned layer arranged above the substrate. In one embodiment, the first channel dopants may be of the same conductivity type as the first well dopants. After removing the single patterned layer, second channel dopants may be introduced into the semiconductor substrate without the single patterned layer. Alternatively, second channel dopants may be introduced into the semiconductor substrate after forming the additional single patterned layer over a region of the silicon layer. In either embodiment, the second channel dopants may be of opposite conductivity type to the first channel dopants. Introducing first and second channel dopants may form respective first and second channel dopant concentrations. In such an embodiment, the first channel dopant concentration may be higher than the second channel dopant concentration.

In an embodiment, the method as described herein may be used to form an integrated circuit. In particular, the method may include using a single patterned layer to form wells of opposite conductivity type within a semiconductor substrate and a silicon layer having first and second portions of opposite conductivity type over the semiconductor substrate. The formation of the wells may include introducing first well dopants into the semiconductor substrate without the single patterned layer. A silicon layer may then be deposited above the semiconductor substrate followed by the formation of the single patterned layer over a region of the silicon layer. Second well dopants may then be introduced into the semiconductor substrate through exposed regions of the silicon layer to form a well having the same net conductivity type as the second well dopants. In a preferred embodiment, the second well dopants are of opposite conductivity type to the first well dopants. Forming the silicon layer may include introducing first gate dopants into exposed portions of the silicon layer and the single patterned layer and subsequently removing the single patterned layer. Second gate dopants may then be introduced into the silicon layer without the single patterned layer. As with the well dopants, the second gate dopants may be of opposite conductivity type to the first gate dopants. In addition, the method may include introducing first channel dopants into the semiconductor substrate without the patterned layer. In a preferred embodiment, the first channel dopants may be of the same conductivity type as the first well dopants. Alternatively or in addition, second channel dopants may be introduced into the semiconductor substrate after forming the single patterned layer. In one embodiment, the second channel dopants may be of opposite conductivity type to the first channel dopants. Introducing first and second channel dopants may form respective first and second channel dopant concentrations, where the first channel dopant concentration may be lower than the second channel dopant concentration.

The method as described herein may form a dual gate CMOS transistor, which includes a first well doped with well impurities of both conductivity types. The first well preferably includes a greater concentration of a well impurity of one conductivity type than a concentration of a well impurity of the other conductivity type. The transistor may also include a second well doped with the well impurity having the lower concentration. A first gate structure doped with gate impurities of both conductivity types may be arranged upon one of the first and second wells. The first gate structure may include a greater concentration of a gate impurity of one conductivity type than a concentration of a gate impurity of the other conductivity type. In an embodiment, the first well may have a net conductivity type opposite to that of the gate structure arranged over it. In addition, a second gate structure doped with the gate impurity having the lower concentration may be arranged upon the other of the first and second wells so that each well has a gate structure arranged upon it.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
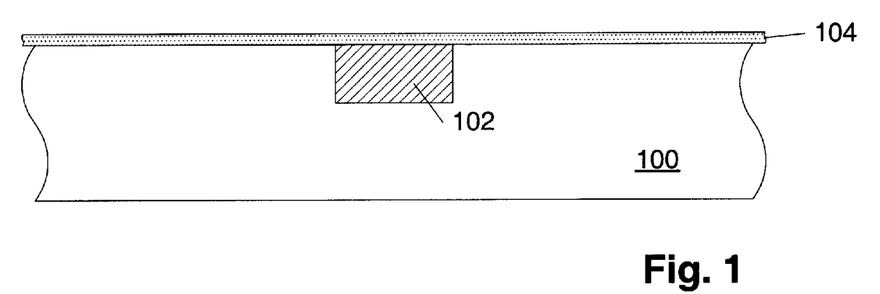
FIG. 1 depicts a partial cross-sectional view of a semiconductor topography in which an isolation region is formed within a substrate and an oxide layer is formed upon the isolation region and substrate.

Turning to the drawings, exemplary embodiments of a method for processing a semiconductor substrate are shown in FIGS. 1–19. FIG. 1 depicts a semiconductor topography in which isolation region 102 is formed within substrate 100. Moreover, dielectric 104 may be formed upon and in contact with the upper surfaces of substrate 100 and isolation region 102. Alternatively, dielectric 104 may be omitted from the topography. Substrate 100 may be a silicon substrate, and may in some embodiments be doped either n-type or p-type. More specifically, substrate 100 may be a monocrystalline silicon substrate or an epitaxial silicon layer grown on a monocrystalline silicon substrate. In addition, substrate 100 may include a silicon on insulator (SOI) layer, which may be formed upon a silicon wafer.

Isolation region 102 may be a field oxide region such as a region of undoped silicon dioxide, which may serve to isolate separate active regions of the semiconductor layer. Although only one isolation region is shown, multiple isolation regions may be included within substrate 100. Isolation region 102 may be formed by a number of techniques such as shallow trench isolation (STI), recessed oxide isolation (ROI), or local oxidation of silicon (LOCOS). In an embodiment, the upper surface of isolation region 102 may be substantially coplanar with the upper surface of substrate 100. Alternatively, the upper surface of isolation region 102 may be elevationally above or below the upper surface of substrate 100. Dielectric 104 may be thermally grown or deposited upon the upper surfaces of substrate 100 adjacent to isolation region 102. Furthermore, dielectric 104 may be deposited upon the upper surface of isolation region 102. Dielectric 104 may include silicon dioxide ($SiO_2$), silicon nitride ($Si_xN_y$), silicon oxynitride ($SiO_xN_y(H_z)$), or silicon dioxide/silicon nitride/silicon dioxide (ONO). In an embodiment, dielectric 104 serves to protect the underlying substrate during subsequent processing.

Figure 2:
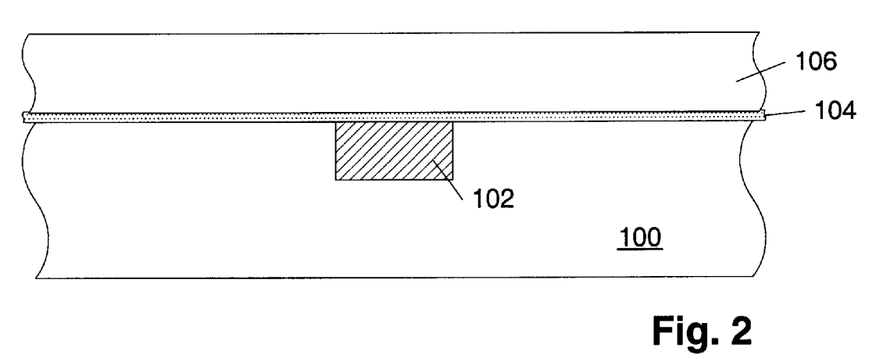
FIG. 2 depicts a partial cross-sectional view of the semiconductor topography in which a layer is formed upon the substrate subsequent to the oxide layer formation of FIG. 1.
Figure 3:
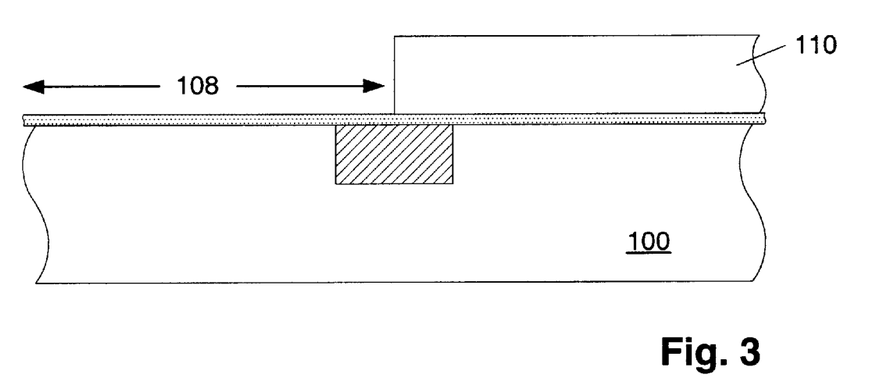
FIG. 3 depicts a partial cross-sectional view of the semiconductor topography in which the layer formed in FIG. 2 is patterned.

Layer 106 may then be formed upon dielectric 104 as shown in FIG. 2. Alternatively, layer 106 may be formed upon the upper surface of substrate 100 and isolation region 102 when dielectric 104 is omitted. Layer 106 may include a photoresist layer such as a deep ultraviolet resist, an I-line resist, a G-line resist, or another resist, such as an e-beam resist or an x-ray resist. Alternatively, layer 106 may include any material compatible with semiconductor fabrication that may be effectively patterned over a substrate. As shown in FIG. 3, layer 106 may be patterned by lithography techniques known to those skilled in the art. More specifically, layer 106 may be patterned such that region 108 of the semiconductor topography may be exposed and patterned layer 110 of layer 106 may remain. In this manner, patterned layer 110 may serve as a masking layer for subsequent processing. In particular, patterned layer 110 may serve to prevent the introduction of impurities in the respective underlying portion of substrate 100.

Figure 4:
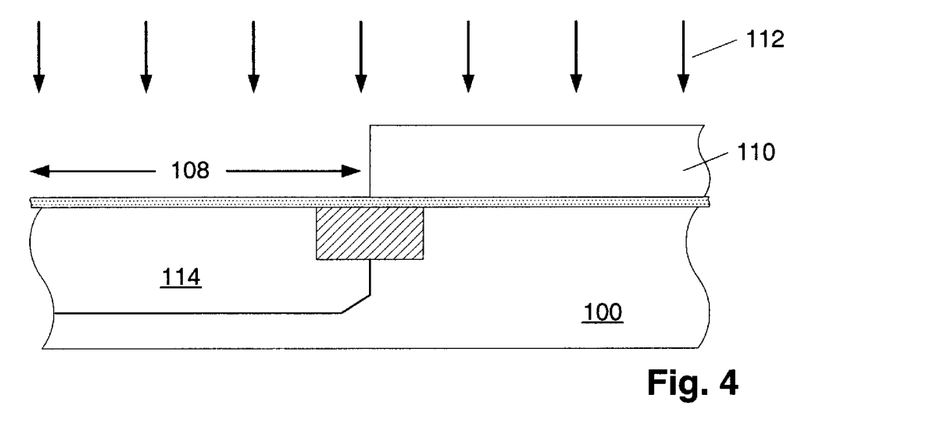
FIG. 4 depicts a partial cross-sectional view of the semiconductor topography in which first well impurities are introduced into the patterned layer and the exposed portion of the substrate subsequent to the formation of the patterned layer of FIG. 3.

FIG. 4 illustrates an introduction of well impurities 112 into patterned layer 110 and exposed portions of dielectric 104, substrate 100, and isolation region 102 to form well 114 within substrate 100 of region 108. Well impurities 112 used in FIG. 4 may include dopants of essentially one conductivity type, either n-type or p-type. In an embodiment in which n-type dopants are used, well impurities 112 may include, for example, phosphorus, arsenic, or antimony. By contrast, in an embodiment in which p-type dopants are used, well impurities 112 may include, for example, boron, boron difluoride, or indium. The introduction of well impurities 112 may include an implant at a high enough energy to form well 114 with a depth between approximately 0.5 microns and approximately 2.0 microns and a concentration between approximately $4.0\times10^{16}$ $cm^{-3}$ and approximately $4.0\times10^{18}$ $cm^{-3}$. Wells with larger or smaller depths and concentrations, however, may be formed depending on the design specifications of the device. In an alternative embodiment, the introduction of well impurities may include a series of implants sufficient to create a well with specific depth and/or concentration profiles. Isolation region 102 may preferentially block impurities 112, such that the depth of well 114 may be reduced to some degree below isolation region 102. Subsequent diffusion may smooth out any such depth variation, however.

Figure 5:
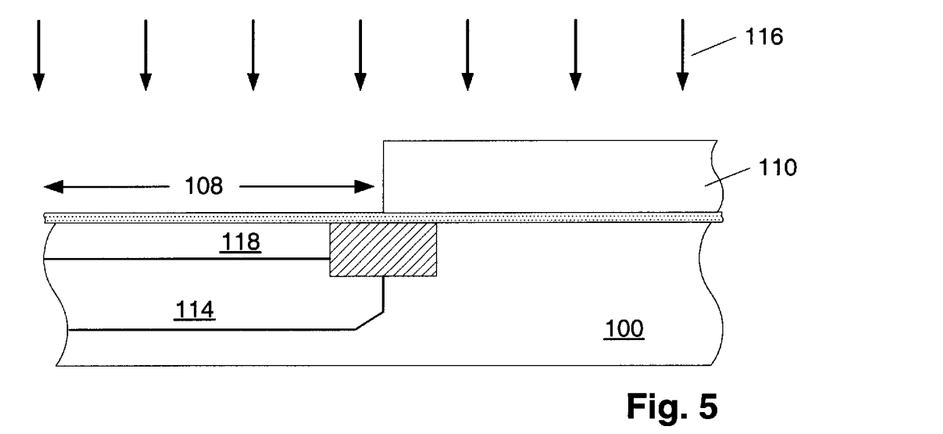
FIG. 5 depicts a partial cross-sectional view of the semiconductor topography in which first channel impurities are introduced into the patterned layer and the exposed portion of the substrate subsequent to the introduction of the first well impurities of FIG. 3.

The introduction of well impurities 112 may be followed by the introduction of channel impurities 116 as illustrated in FIG. 5. Such an introduction of impurities may form channel dopant region 118 within well 114. Preferably, channel impurities 116 are of the same conductivity type as well impurities 112. As such, channel impurities 116 may include n-type dopants, such as phosphorus, arsenic, or antimony when n-type dopants are used for well impurities 112. Alternatively, channel impurities 116 may include p-type dopants, such as boron, boron difluoride, or indium when p-type dopants are used for well impurities 112. The introduction of channel impurities 116 may form channel dopant region 118 with a peak concentration between approximately $2.0\times10^{16}$ $cm^{-3}$ and approximately $2.0\times10^{18}$ $cm^{-3}$ and depth between approximately 0.05 microns and approximately 0.25 microns. However, channel dopant regions of larger or smaller depths and concentrations may be formed depending on the design specifications of the device. As with the formation of well 114, channel dopant region 118 may be formed by a single implant or a series of implants. Channel dopant region 118 may serve to control punchthrough and short channel effects of the subsequently formed transistor. In an embodiment in which n-type dopants are introduced, channel dopant region 118 may serve to adjust the threshold of a subsequently formed p-channel transistor. Although the introduction of well impurities 112 in FIG. 4 are shown before the introduction of channel impurities 116 in FIG. 5, the introduction of such impurities may be reversed. In this manner, channel dopant region 118 may be formed within substrate 100 before well 114 is formed. Alternatively, the introduction of channel impurities 116 may be omitted such that channel dopant region 118 is not formed.

Figure 6:
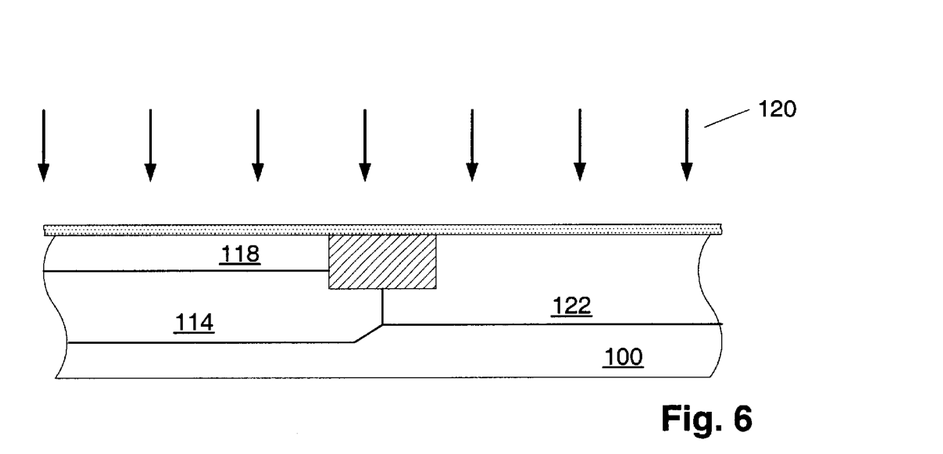
FIG. 6 depicts a partial cross-sectional view of the semiconductor topography in which the patterned layer is removed subsequent to the introduction of the first channel impurities of FIG. 4 and second well impurities are subsequently introduced into the substrate.

FIG. 6 illustrates the removal of patterned layer 110 and the introduction of well impurities 120 into substrate 100 without the patterned layer. Patterned layer 110 may be removed by using stripping processes such as a wet etch or a reactive ion etch. The introduction of well impurities 120 may form well 122 within the region of substrate 100 previously covered by patterned layer 110. Well 122 may have a depth between approximately 0.5 microns and 2.0 microns and a concentration between approximately $2.0\times10^{16}$ $cm^{-3}$ and approximately $2.0\times10^{18}$ $cm^{-3}$. However, larger or smaller depths and concentrations of well 122 may be appropriate depending on the semiconductor device being formed. In an embodiment, well 122 may be formed to a depth less than or equal to well 114, to avoid formation of a region doped with impurities 120 underlying well 114. Such a region could short-circuit well 122 to a well on the other side of well 114. In an embodiment in which well 114 and the substrate are of the same conductivity type, the formation of a region doped with impurities 120 underlying well 114 may also cause high resistance between well 114 and the substrate. However, in some applications, high resistance and/or short-circuiting may be desirable. Therefore, well 122 may in some embodiments be formed to a depth deeper than well 114.

In a preferred embodiment, well impurities 120 may be of opposite conductivity type to that of well impurities 112 used in FIG. 4. Moreover, well impurities 120 may be introduced in a manner such that well 114 may still maintain the net conductivity type of well impurities 112. As such, well impurities 120 may be introduced at a low enough concentration to be compensated by the previous introduction of well impurities 112. In other words, well impurities 112 may be introduced at a high enough concentration to compensate for the subsequent introduction of well impurities 120. As such, a dose of well impurities 112 may be larger than a dose of well impurities 120. For example, the dose of the well impurities 112 may be up to approximately 5.0 times larger than the dose of well impurities 120. More specifically, the dose of the well impurities 112 may be approximately 1.5 times to approximately 3.0 times larger than the dose of the well impurities 120. Consequently, the introduction of well impurities 112 and 120 may form two distinct wells having different net conductivity type and different dopant concentrations. In particular, one well may have a higher concentration of dopants than the other. In the embodiment of FIG. 6, well 114 may have a higher concentration of dopants than well 122. However, the net concentration of the dominant carrier type in well 114 may be comparable to or smaller than the carrier concentration of well 122.

Figure 7:
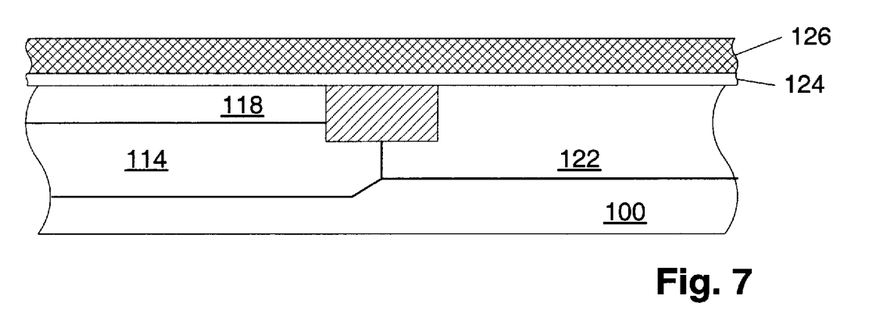
FIG. 7 depicts a partial cross-sectional view of the semiconductor topography in which the oxide layer is removed subsequent to the introduction of the second well impurities of FIG. 6 and a gate dielectric layer and a silicon layer are subsequently formed upon the substrate.

After the formation of well 122, dielectric 104 may be removed and gate dielectric 124 and silicon layer 126 may be formed upon the upper surface of substrate 100 and isolation region 102 as shown in FIG. 7. Dielectric 104 may be removed by using stripping processes such as a wet etch or a reactive ion etch stripping process. Gate dielectric layer 124 may include silicon dioxide ($SiO_2$), silicon nitride ($Si_xN_y$), silicon oxynitride ($SiO_xN_y(H_z)$), or silicon dioxide/silicon nitride/silicon dioxide (ONO). Alternatively, gate dielectric 124 may include metal oxides, such as aluminum oxide ($Al_2O_3$), titanium oxide ($TiO_2$), tantalum oxide ($Ta_2O_5$), hafnium oxide ($HfO_2$), and zirconium oxide ($ZrO_2$), or metal silicates. In addition, other materials typically used for gate dielectric materials in the fabrication of semiconductor devices may be used. Gate dielectric 124 may be grown upon substrate 100 using wet or dry thermal oxidation of the silicon substrate. Alternatively, gate dielectric 124 may be deposited on substrate 100 using a technique such as chemical-vapor deposition ("CVD"). Gate dielectric 124 may have a thickness between, for example, approximately 8 angstroms and approximately 125 angstroms. Larger or smaller thicknesses of gate dielectric 124, however, may be appropriate depending on the material used and the semiconductor device being formed. Silicon layer 126 may include polycrystalline or amorphous silicon with a thickness between approximately 300 angstroms and approximately 1500 angstroms, or preferably between approximately 500 angstroms and approximately 1000 angstroms. However, larger or smaller thicknesses of silicon layer 126 may be appropriate depending on the semiconductor device being formed.

Figure 8:
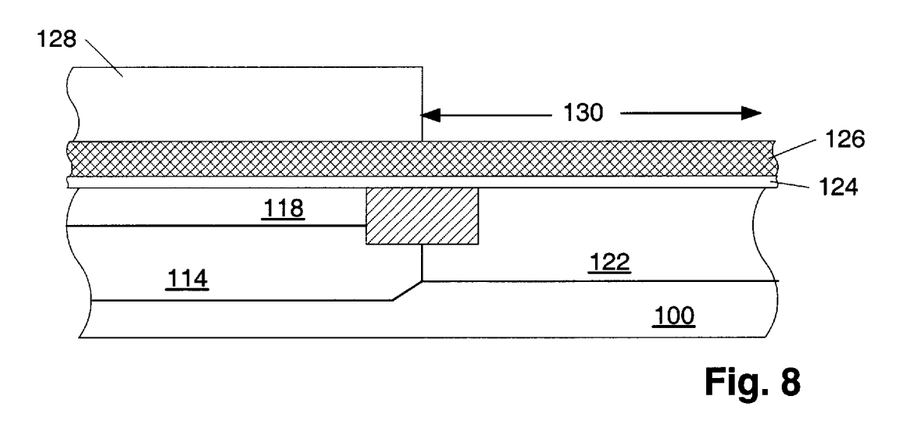
FIG. 8 depicts a partial cross-sectional view of the semiconductor topography in which a patterned layer is formed upon a portion of the silicon layer subsequent to the layer formations of FIG. 7.
Figure 9:
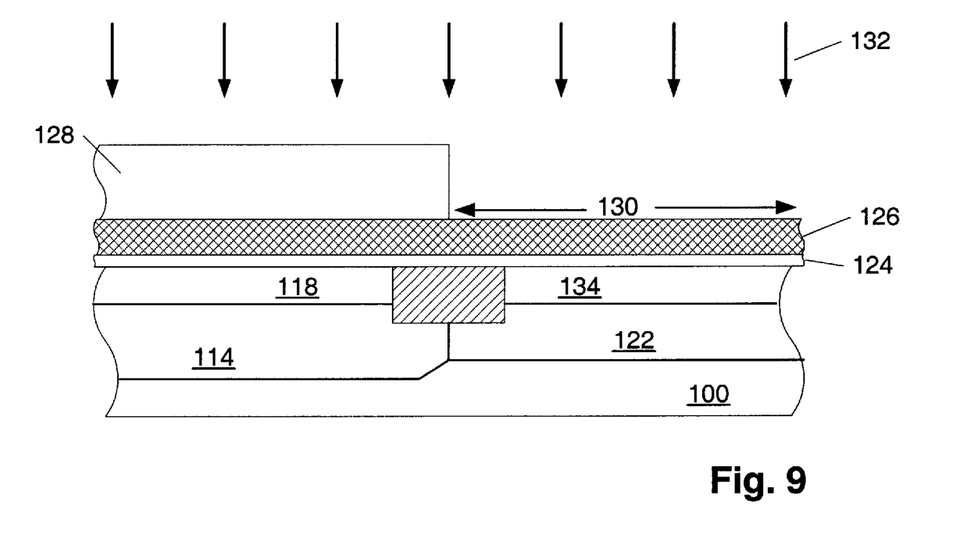
FIG. 9 depicts a partial cross-sectional view of the semiconductor topography in which second channel impurities are introduced into the patterned layer and the exposed portion of the substrate subsequent to the formation of the patterned layer of FIG. 8.

FIG. 8 illustrates the formation of patterned layer 128 over substrate 100 such that region 130 of the semiconductor topography may be exposed. The formation of patterned layer 128 may be similar to the formation of patterned layer 110 in FIG. 3. Similarly, patterned layer 128 may serve to protect the underlying topography from subsequent processing. In addition, patterned layer 128 may include any of the materials which may be used for layer 106 in FIG. 2. After the formation of patterned layer 128, channel impurities 132 may be introduced into patterned layer 128 and exposed region 130 to form channel dopant region 134 within well 122 as illustrated in FIG. 9. Preferably, channel impurities 132 are of the same conductivity type as well impurities 120. As such, channel impurities 132 may be of opposite conductivity type to well impurities 112 and channel impurities 116. The introduction of channel impurities 132 may form channel dopant region 134 with a peak concentration between approximately $2.0\times10^{16}$ cm$^{-3}$ and approximately $2.0\times10^{18}$ cm$^{-3}$ and depth between approximately 0.05 microns and approximately 0.25 microns. Channel dopant regions with larger or smaller depths and concentrations, however, may be formed depending on the design specifications of the device. Alternatively, the introduction of channel impurities 132 may be omitted such that channel dopant region 134 is not formed.

Figure 10:
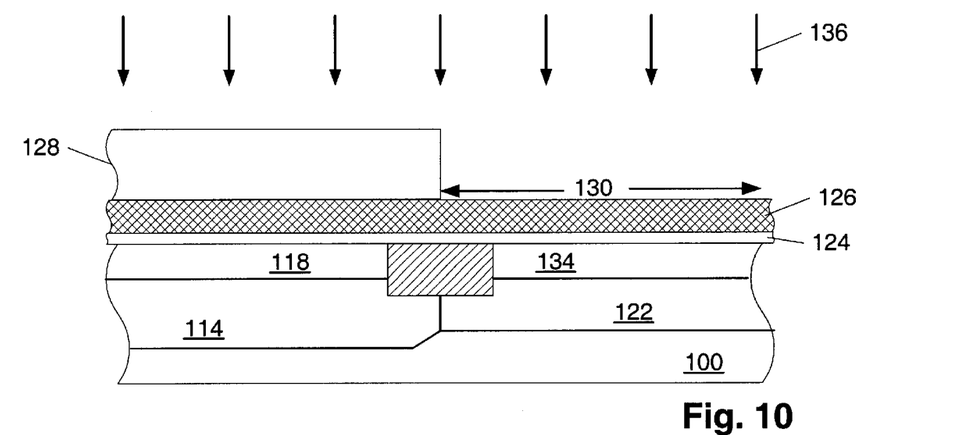
FIG. 10 depicts a partial cross-sectional view of the semiconductor topography in which first gate impurities are introduced into the patterned layer and the exposed portion of the silicon layer subsequent to the introduction of the second channel impurities of FIG. 9.

Gate impurities 136 may be introduced into patterned layer 128 and the portion of silicon layer 126 corresponding to region 130, as shown in FIG. 10. Such an introduction of impurities may dope region 130 of the silicon layer such that a gate may be subsequently formed for either an n-channel or p-channel transistor in a dual gate CMOS approach. As such, the portion of silicon layer 126 corresponding to region 130 may either be n-type to subsequently form an n-channel transistor or p-type to subsequently form a p-type channel transistor. In a preferred embodiment, gate impurities 136 may be of opposite conductivity type as well impurities 120 and channel impurities 132. The introduction of gate impurities 136 may dope the region 130 of silicon layer 126 to a peak concentration between approximately $1.0\times10^{20}$ cm$^{-3}$ and approximately $2.0\times10^{21}$ cm$^{-3}$. However, larger or smaller concentrations may be formed depending on the design specifications of the device. In a preferred embodiment, gate impurities 136 may be introduced in a manner such that gate impurities 136 are not implanted through silicon layer 126. Introduction of gate impurities 136 through silicon layer 126 may damage gate dielectric layer 124 and adversely affect the performance of the device by causing reliability issues. In addition, the introduction of gate impurities 136 into substrate 100 may undesirably shift the threshold voltage of the device and/or cause significant variation of the threshold voltage.

Figure 11A:
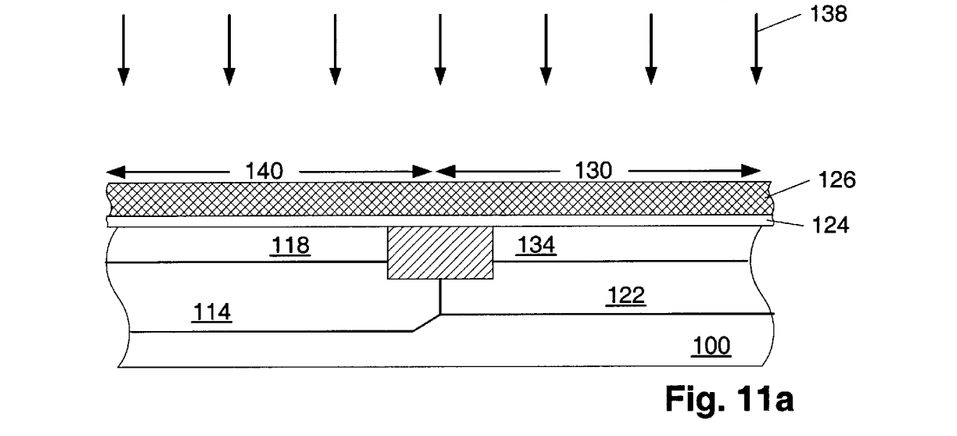
FIG. 11a depicts a partial cross-sectional view of the semiconductor topography in which the patterned layer is removed subsequent to the introduction of the first gate impurities of FIG. 10 and second gate impurities are subsequently introduced into the silicon layer.

Patterned layer 128 may be removed as illustrated in FIG. 11a to expose region 140 of silicon layer 126. The removal of patterned layer 128 may be conducted by a stripping process similar to the process used for the removal of patterned layer 110 in FIG. 6. Gate impurities 138 may then be introduced into silicon layer 126 without the patterned layer. Preferably, gate impurities 138 are of opposite conductivity type to that of gate impurities 136 of FIG. 10. In addition, the introduction of gate impurities 138 may dope silicon layer 126 in a manner such that a transistor of opposite conductivity to that of region 130 of silicon layer 126 may be subsequently formed from region 140 of silicon layer 126. In this manner, gate impurities 138 may be introduced in a manner such that region 130 of silicon layer 126 may still maintain a net conductivity type of gate impurities 136. As such, gate impurities 138 may be introduced at a low enough concentration to be compensated by the previous introduction of gate impurities 136. As such, the introduction of gate impurities 138 may dope the region 140 of silicon layer 126 to a peak concentration between approximately $5.0\times10^{19}$ cm$^{-3}$ and approximately $1.0\times10^{21}$ cm$^{-3}$. However, larger or smaller concentrations may be appropriate depending on the semiconductor device being formed. Alternatively stated, gate impurities 136 may be introduced at a high enough concentration to compensate for the subsequent introduction of gate impurities 138. As such, a dose of gate impurities 136 may be larger than a dose of gate impurities 138. For example, the dose of the gate impurities 136 may be up to approximately 5.0 times larger than the dose of gate impurities 138. More specifically, the dose of the gate impurities 136 may be approximately 1.5 times to approximately 3.0 times larger than the dose of the gate impurities 138.

Consequently, the introduction of gate impurities 136 and 138 may form two distinct portions of silicon layer 126 comprising different dopant concentrations. In particular, one portion of silicon layer 126 may have a higher concentration of dopants than the other. In the embodiment of FIG. 11a, region 130 of silicon layer 126 may have a higher concentration of dopants than region 140. However, the net concentration of the dominant carrier type in region 130 may be comparable to or smaller than the carrier concentration of region 140.

Figure 11B:
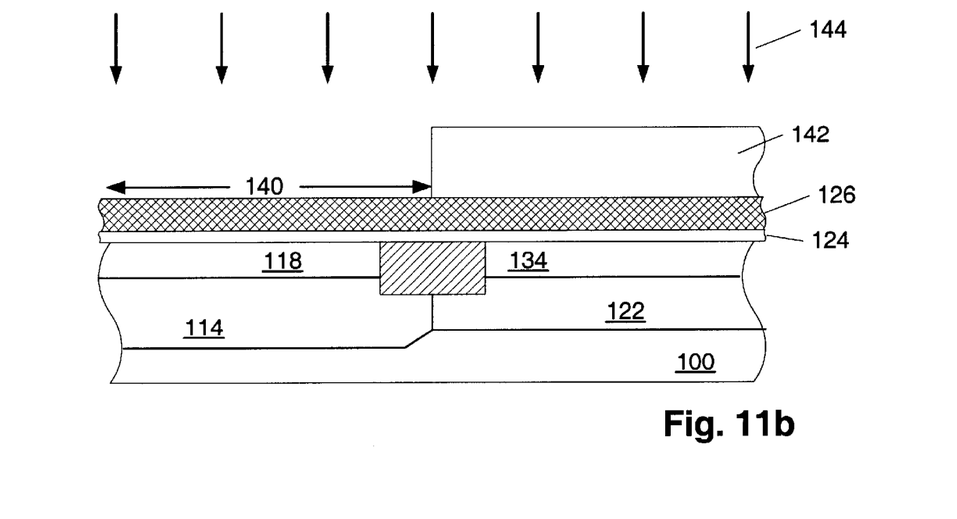
FIG. 11b depicts a partial cross-sectional view of the semiconductor topography in which the patterned layer is removed subsequent to the introduction of the first gate impurities of FIG. 10 and another patterned layer is subsequently formed over the portion of the silicon layer opposite from that over which the patterned layer of FIG. 10 was formed, where second gate impurities are introduced into the patterned layer and the exposed portion of the silicon layer.

In an alternative embodiment to that of FIG. 11a, FIG. 11b illustrates removing patterned layer 128 to expose region 140 of silicon layer 126. In addition, patterned layer 142 may be formed over region 130 of silicon layer 126.

Patterned layer 142 may be formed in a similar manner to that described for patterned layer 110 of FIG. 3. Gate impurities 144 may be introduced into patterned layer 142 and region 140 of silicon layer 126. As with gate impurities 138 of FIG. 11a, gate impurities 144 are preferably of opposite conductivity type to that of gate impurities 136. However, in FIG. 11b, gate impurities 144 may be introduced into silicon layer 126 at a similar dose as used for gate impurities 136. In this manner, the introduction of gate impurities 144 is not compensated by gate impurities 136 previously introduced into portion 130. Similarly, the introduction of gate impurities 136 does not have to be designed to compensate for the introduction of gate impurities 144. In addition, regions 130 and 140 of silicon layer 126 may have similar dopant concentration levels. However, both regions may also include different concentrations of dopants. Consequently, the method may follow the embodiment of FIGS. 11a or 11b to dope portion 140 of silicon layer 126. Alternatively, the process steps of FIGS. 11a and 11b may be omitted if layer 126 in FIG. 7 is deposited as in-situ doped layer. Preferably, such an in-situ doped layer would include dopants of an opposite conductivity type than of gate impurities 136.

Figure 12:
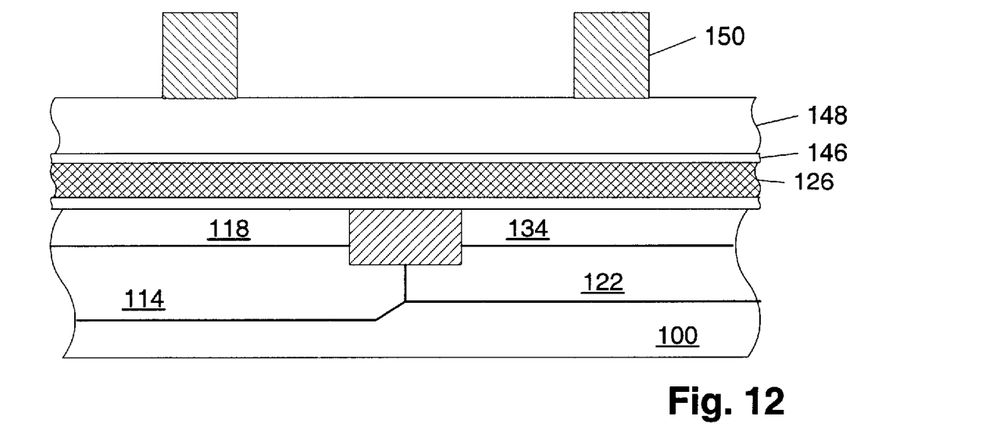
FIG. 12 depicts a partial cross-sectional view of the semiconductor topography in which any remaining patterned layer is removed subsequent to the introduction of the second gate impurities of FIGS. 11a and 11b, a strapping layer and an insulating layer are subsequently formed upon the silicon layer, and a masking layer is patterned over the insulating layer.

Turning to FIG. 12, any remaining patterned layer may be removed so that silicon layer 126 may be exposed. Conductive strapping layer 146 may be formed upon silicon layer 126 to strap gate regions of opposite conductivity type together. For example, strapping layer 146 may provide a conductive path across a p-n junction formed when a polysilicon connection is made to gates of opposite conductivity type. The strapping layer may also serve to reduce gate resistance. Strapping layer 146 may include a low-resistivity material, such as tungsten or tungsten silicide. Alternatively, strapping layer 146 may be omitted from the structure of FIG. 12. In addition, a diffusion barrier layer (not shown) may be formed between silicon layer 126 and strapping layer 146. Such a layer may prevent the impurities in silicon layer 126 from diffusing into strapping layer 146. The diffusion barrier layer may include materials, such as undoped polysilicon, silicon oxide, silicon nitride, tungsten nitride, and titanium nitride. Insulating layer 148 may be deposited upon strapping layer 146 or upon silicon layer 126 if strapping layer 146 has been omitted. Insulating layer 148 may include a dielectric material such as, silicon dioxide, silicon nitride, silicon oxynitride, or silicon dioxide/silicon nitride/silicon dioxide. Insulating layer 148 may be subsequently used for a self-aligned contact fabrication process. Masking layer 150 may then be patterned above insulating layer 148 such that gate structures may be subsequently formed.

Figure 13:
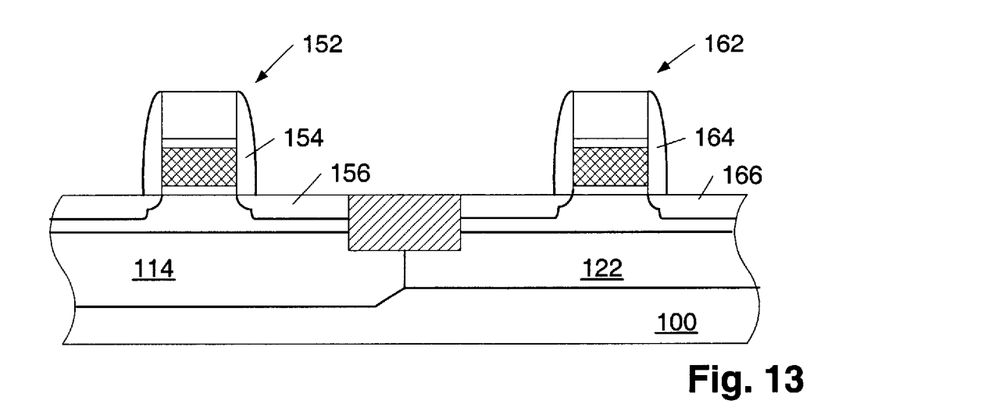
FIG. 13 depicts a partial cross-sectional view of the semiconductor topography in which gate structures are patterned subsequent to the formation of the strapping layer and insulating layer of FIG. 12, and spacers and source and drain regions are subsequently formed to form a dual gate transistor pair.

FIG. 13 illustrates gate structures 152 and 162, which may include polysilicon of opposite conductivity type. For example, gate structure 152 may form an n-channel transistor and gate structure 162 may form a p-channel transistor or vice versa. Spacers 154 and 164 may be formed adjacent to gate structures 152 and 162, respectively. In addition, source/drain regions 156 and 166 may formed within wells 114 and 122, self aligned to gate structures 152 and 162, respectively. In an embodiment, source/drain regions 156 and 166 may include extensions and/or halos formed below spacers 154 and 164. In an embodiment, the method may form a dual gate transistor pair, which includes a first well doped with impurities of both conductivity types. The first well may include a greater concentration of a well impurity of one conductivity type than a well impurity of the other conductivity type. The transistor pair may include a second well doped with the well impurity having the lower concentration. A first gate structure may be formed upon one of the first and second wells. In one embodiment, the first gate structure may be of opposite conductivity type to that of the underlying well. The first gate structure may include a greater concentration of a gate impurity of one conductivity type than a gate impurity of the other conductivity type. The dual gate transistor pair may also include a second gate structure arranged upon the other of the first and second wells. The second gate structure may be doped with the gate impurity of lower concentration.

Figure 14:
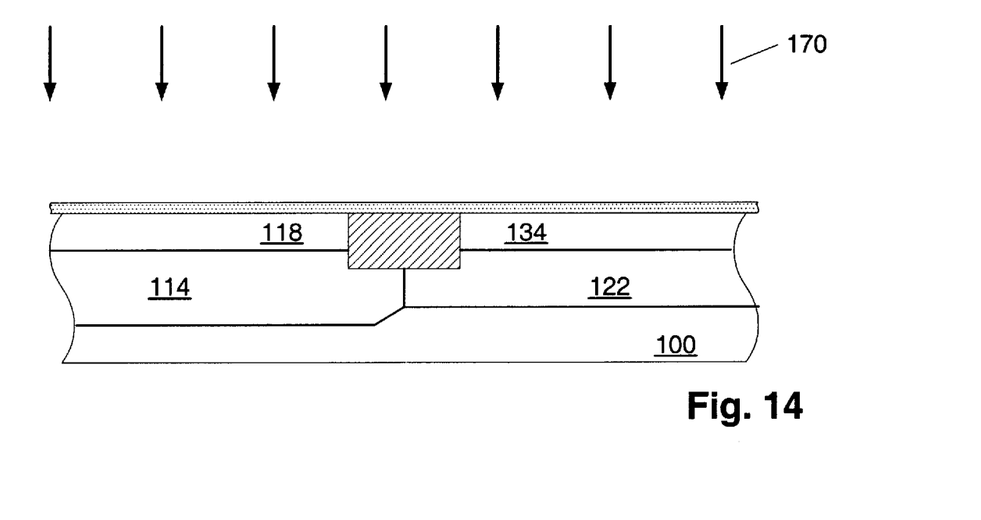
FIG. 14 depicts a partial cross-sectional view of the semiconductor topography in an embodiment for which second channel impurities are introduced into the substrate subsequent to the introduction of second well impurities of FIG. 6.
Figure 15:
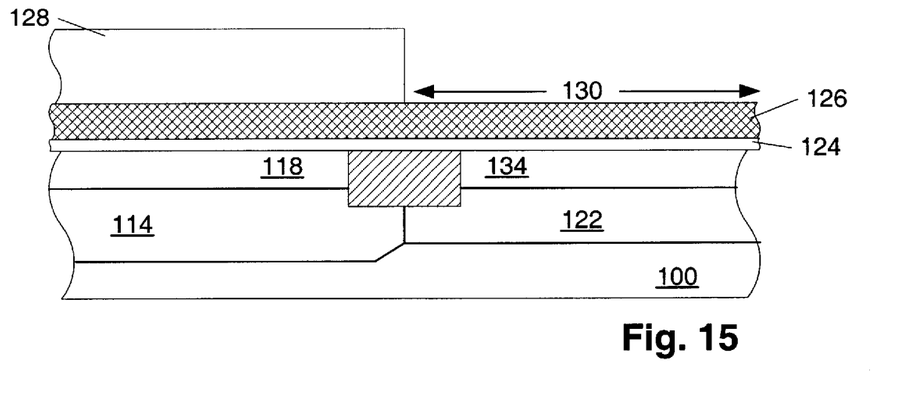
FIG. 15 depicts a partial cross-sectional view of the semiconductor topography in which the oxide layer is removed subsequent to the introduction of the second channel impurities of FIG. 14 and wherein a gate dielectric layer, a silicon layer, and patterned layer are subsequently formed upon the substrate.

In an alternative embodiment, a method for the formation of channel dopant region 134 may follow the process steps of FIGS. 14–15. FIG. 14 illustrates introducing channel impurities 170 into substrate 100 to form channel dopant region 134 subsequent to the introduction of well impurities 120 in FIG. 6. Alternatively, channel impurities 170 may be introduced before the introduction of well impurities 120. Preferably, channel impurities 170 are of opposite conductivity type to that of channel impurities 116 of FIG. 5. Furthermore, channel impurities 170 may be introduced in a manner such that channel dopant region 118 may still maintain a net conductivity type of channel impurities 116. As such, channel impurities 170 may be introduced at a low enough concentration to be compensated by the previous introduction of channel impurities 116. In other words, channel impurities 116 may be introduced at a high enough concentration to compensate for the subsequent introduction of channel impurities 170. As such, a dose of channel impurities 116 may be larger than a dose of channel impurities 170. For example, the dose of the channel impurities 116 may be up to approximately 5.0 times larger than the dose of channel impurities 170. More specifically, the dose of the channel impurities 116 may be approximately 1.5 times to approximately 3.0 times larger than the dose of the channel impurities 170.

Consequently, channel dopant regions 118 and 134 may have different dopant concentrations. In particular, one channel dopant region may have a higher concentration of dopants than the other. In the embodiment of FIG. 14, channel dopant region 118 may have a higher concentration of dopants than channel dopant region 134. However, the net concentration of the dominant carrier type in region 118 may be comparable to or smaller than the carrier concentration of region 134. FIG. 15 illustrates the formation of gate dielectric 124, silicon layer 126, and patterned layer 128 similar to the process steps of FIGS. 7 and 8. As such, region 130 of silicon layer 126 may be exposed to subsequent processing. The method may resume with the process steps of FIG. 10, in which gate impurities 136 are introduced into patterned layer 128 and region 130.

Figure 16:
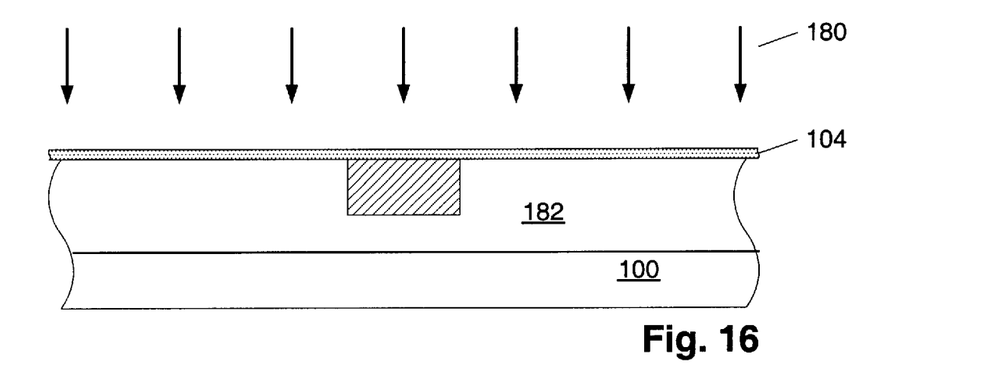
FIG. 16 depicts a partial cross-sectional view of a semiconductor topography in an alternative embodiment in which first well impurities are introduced into the substrate subsequent to oxide layer formation of FIG. 1.
Figure 17:
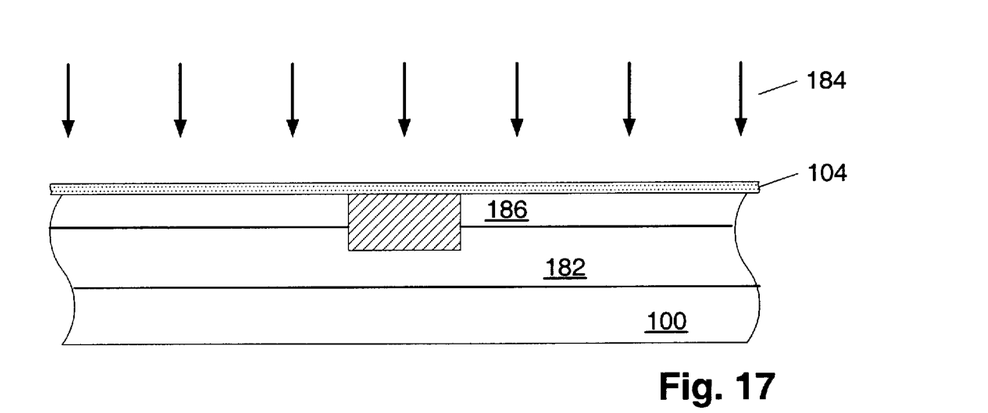
FIG. 17 depicts a partial cross-sectional view of the semiconductor topography in which first channel impurities are introduced into the substrate subsequent to the introduction of the first well impurities of FIG. 16.

A further alternative embodiment to the method as described herein is incorporated in FIGS. 16–19. FIG. 16 illustrates an introduction of well impurities 180 into substrate 100 subsequent to FIG. 1. As such, well impurities may be introduced into substrate 100 without a patterned layer to form well 182. In addition, channel impurities 184 may be introduced into substrate 100 without a patterned layer to form channel dopant region 186 as illustrated in FIG. 17. Alternatively, channel impurities 184 may be introduced into substrate 100 prior to the introduction of well impurities 180. In another embodiment, the introduction of channel impurities 184 may be omitted from the method such that channel dopant region 186 is not formed.

Figure 18:
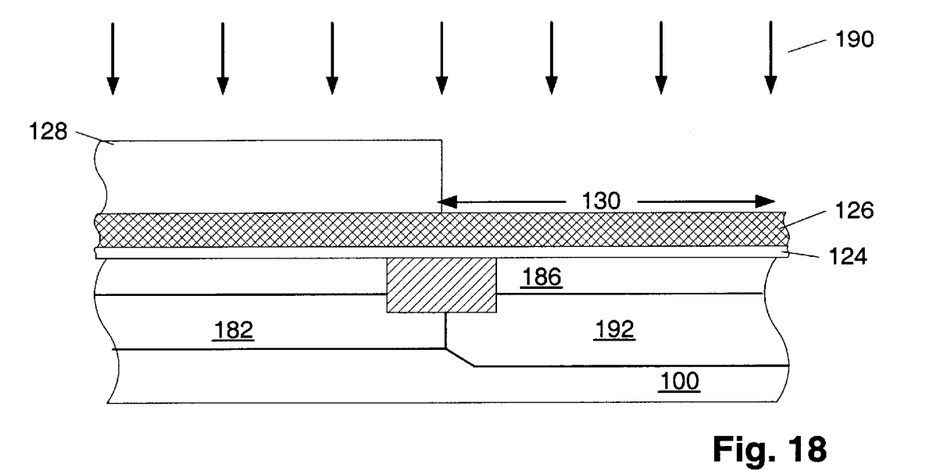
FIG. 18 depicts a partial cross-sectional view of the semiconductor topography in which a silicon layer is formed upon the substrate subsequent to the introduction of first channel impurities of FIG. 17, a patterned layer is formed upon a portion of the silicon layer, and second well impurities are subsequently introduced into the patterned layer and the substrate underlying the exposed portion of the silicon layer.

In FIG. 18, dielectric 104 may be removed and gate dielectric 124, silicon layer 126, and patterned layer 128 may be formed upon substrate 100. The removal and addition of such layers may be achieved by similar removal and formation processes to those of FIGS. 7 and 8. FIG. 18 illustrates the introduction of well impurities 190 into patterned layer 128 and region 130 of the silicon layer 126 and its underlying substrate. As such, well 192 may be formed within substrate 100 and more specifically within the portion of well 182 underlying region 130. Well impurities 190 may be of opposite conductivity type to that of well impurities 180 of FIG. 16. Moreover, well impurities 190 may be introduced in a manner such that the net conductivity type of well 192 may be of opposite conductivity type to that of well 182. As such, well impurities 180 may be introduced at a low enough concentration to be compensated by the subsequent introduction of well impurities 190. Alternatively stated, well impurities 190 may be introduced at a high enough concentration to compensate for the previous introduction of well impurities 180. As such, a dose of well impurities 190 may be larger than a dose of well impurities 180. For example, the dose of the well impurities 190 may be up to approximately 5.0 times larger than the dose of well impurities 180. More specifically, the dose of the well impurities 190 may be approximately 1.5 times to approximately 3.0 times larger than the dose of the well impurities 180.

Consequently, the introduction of well impurities 180 and 190 may form two distinct wells comprising different dopant concentrations. In particular, one well may have a higher concentration of dopants than the other. As in the embodiment of FIG. 18, well 192 may have a higher concentration of dopants than well 182. In an embodiment, well 192 may be formed to a depth greater than or equal to well 182, to avoid formation of a region doped with impurities 180 underlying well 192. Such a region could short-circuit well 182 to a well on the other side of well 192. In an embodiment in which well 192 and the substrate are of the same conductivity, the formation of a region doped with impurities 180 underlying well 192 may also cause high resistance between well 192 and the substrate. However, in some applications, such high resistance and/or short-circuiting may be desirable. Therefore, well 192 may in some embodiments be formed to a depth less than well 182.

Figure 19:
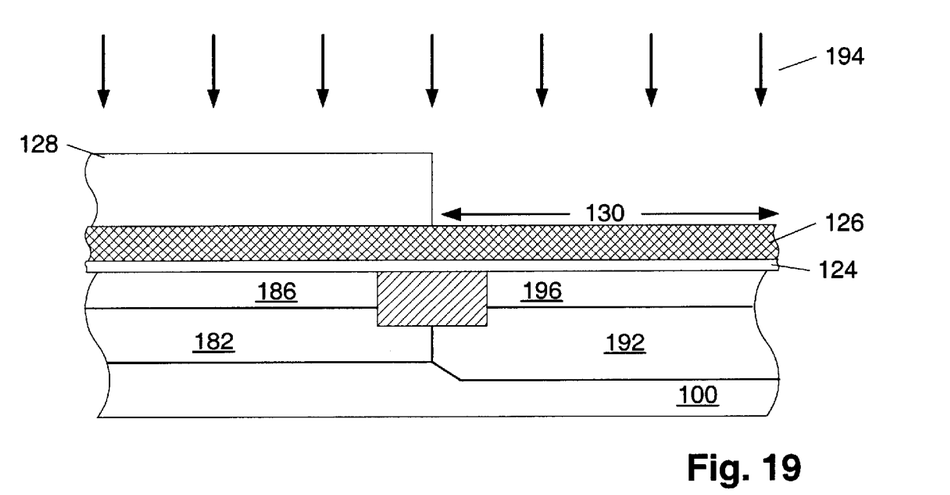
FIG. 19 depicts a partial cross-sectional view of the semiconductor topography in which second channel impurities are introduced into the patterned layer and the substrate underlying the exposed portion of the silicon layer subsequent to the introduction of second well impurities of FIG. 18.

FIG. 19 illustrates the introduction of channel impurities 194 into patterned layer 128 and region 130 of silicon layer 126 and the underlying substrate. Such an introduction may form channel dopant region 196 within well 192. Preferably, channel impurities 194 are of opposite conductivity type to channel impurities 184. Moreover, channel impurities 194 may be introduced in a manner such that the net conductivity type of channel dopant region 196 may be opposite to that of channel dopant region 186. As such, channel impurities 184 may be introduced at a low enough concentration to be compensated by the subsequent introduction of channel impurities 194. In other words, channel impurities 194 may be introduced at a high enough concentration to compensate for the previous introduction of channel impurities 184. As such, a dose of channel impurities 194 may be larger than a dose of channel impurities 184. For example, the dose of the channel impurities 194 may be up to approximately 5.0 times larger than the dose of channel impurities 184. More specifically, the dose of the channel impurities 194 may be approximately 1.5 times to approximately 3.0 times larger than the dose of the channel impurities 184.

Consequently, channel dopant regions 186 and 196 may include different dopant concentrations. In particular, one channel dopant region may have a higher concentration of dopants than the other. In the embodiment of FIG. 19, channel dopant region 196 may have a higher concentration of dopants than channel dopant region 186. However, the net concentration of the dominant carrier type in region 196 may be comparable to or smaller than the carrier concentration of region 186. The method may resume with the process steps of FIG. 10, in which gate impurities 136 are introduced into patterned layer 128 and region 130.

It will be appreciated to those skilled in the art having the benefit of this disclosure that this invention is believed to provide a method and a system for processing a semiconductor topography. Further modifications and alternative embodiments of various aspects of the invention will be apparent to those skilled in the art in view of this description. For example, each implant may include a single implant or a series of implants using various species, energies, and doses to optimize the resulting profile. Furthermore, a thermal anneal may follow any of the implants to electrically activate and/or diffuse the dopants. Such an anneal process may be activated immediately after each implant, or the various implant anneals may be combined into one or more steps later in the process. It is intended that the following claims be interpreted to embrace all such modifications and changes and, accordingly, the drawings and the specification are to be regarded in an illustrative rather than a restrictive sense.

What is claimed is:

1. A method for processing a semiconductor substrate, comprising:
   forming first and second wells of opposite conductivity type using a single patterned layer; and
   forming a silicon layer having first and second portions of opposite conductivity type above the semiconductor substrate using an additional single patterned layer.

2. The method of claim 1, wherein said forming the first and second wells comprise:
   forming the single patterned layer over a portion of the semiconductor substrate;
   introducing first well dopants into exposed portions of the semiconductor substrate and into the patterned layer;
   removing the single patterned layer; and
   introducing second well dopants into the semiconductor substrate without the single patterned layer, wherein the second well dopants are of opposite conductivity type to the first well dopants.

3. The method of claim 2, wherein said introducing first and second well dopants comprises forming respective first and second well dopant concentrations, and wherein the first well dopant concentration is higher than the second well dopant concentration.

4. The method of claim 3, wherein said introducing first and second well dopants comprises implanting, and wherein a dose of the first well dopants is approximately 1.5 times to approximately 3.0 times larger than a dose of the second well dopants.

5. The method of claim 1, wherein each of said first and second portions of the silicon layer is arranged above one of said first and second wells, and wherein each of said portions has opposite conductivity type to the respective underlying well.

6. The method of claim 1, wherein said forming the silicon layer comprises:
   depositing a silicon layer comprising dopants of one conductivity type over the semiconductor substrate;
   forming the additional single patterned layer over a region of the silicon layer; and
   introducing gate dopants into exposed portions of the silicon layer and the additional single patterned layer, wherein the gate dopants are of opposite conductivity type to the one conductivity type.

7. The method of claim 1, wherein said forming the silicon layer comprises:
   depositing a silicon layer over the semiconductor substrate;
   forming the additional single patterned layer over a region of the silicon layer;
   introducing first gate dopants into exposed portions of the silicon layer and the additional single patterned layer;
   removing said additional single patterned layer; and
   introducing second gate dopants into the silicon layer without the additional single patterned layer, wherein the second gate dopants are of opposite conductivity type to the first gate dopants.

8. The method of claim 7, wherein said introducing first and second gate dopants comprises forming respective first and second gate dopant concentrations within the silicon layer, and wherein the first gate dopant concentration is higher than the second gate dopant concentration.

9. The method of claim 7, further comprising introducing first channel dopants into the exposed portion of the semiconductor substrate prior to said removing the single patterned layer, wherein the first channel dopants are of the same conductivity type as the first well dopants.

10. The method of claim 9, further comprising introducing second channel dopants into the semiconductor substrate without the single patterned layer, wherein the second channel dopants are of opposite conductivity type to the first channel dopants.

11. The method of claim 10, wherein said introducing first and second channel dopants comprises forming respective first and second channel dopant concentrations, and wherein the first channel dopant concentration is higher than the second channel dopant concentration.

12. The method of claim 9, further comprising introducing second channel dopants into the semiconductor substrate subsequent to said forming the additional single patterned layer over the region of the silicon layer, wherein the second channel dopants are of opposite conductivity type to the first channel dopants.

13. The method of claim 1, further comprising patterning the silicon layer to form a gate structure above each of the first and second wells.

14. A method of making an integrated circuit, comprising:
   forming wells of opposite conductivity type within a semiconductor substrate; and
   forming a silicon layer having first and second portions of opposite conductivity type over the semiconductor substrate, wherein said forming wells and said forming the silicon layer are done using a single patterned layer.

15. The method of claim 14, wherein said forming wells comprises:
   introducing first well dopants into the semiconductor substrate without the single patterned layer;
   depositing the silicon layer above the semiconductor substrate;
   forming the single patterned layer over a region of the silicon layer; and
   introducing second well dopants into the semiconductor substrate through exposed regions of the silicon layer to form a well having the same net conductivity type as the second well dopants, wherein the second well dopants are of opposite conductivity type to the first well dopants.

16. The method of claim 15, wherein said forming the silicon layer comprises:
   introducing first gate dopants into exposed portions of the silicon layer and the single patterned layer;
   removing said single patterned layer; and
   introducing second gate dopants into the silicon layer without the single patterned layer, wherein the second gate dopants are of opposite conductivity type to the first gate dopants.

17. The method of claim 16, further comprising:
   introducing first channel dopants into the semiconductor substrate without the patterned layer, wherein the first channel dopants are of the same conductivity type as the first well dopants; and
   introducing second channel dopants into the semiconductor substrate subsequent to said forming the single patterned layer, and wherein the second channel dopants are of opposite conductivity type to the first channel dopants.

18. The method of claim 17, wherein said introducing first and second channel dopants comprises forming respective first and second channel dopant concentrations, and wherein the first channel dopant concentration is lower than the second channel dopant concentration.

19. A method for processing a semiconductor substrate, comprising forming first and second wells of opposite conductivity type within distinct lateral portions of the semiconductor substrate using a single patterned layer, wherein said forming the first and second wells comprises forming the second well subsequent to the first well and with a depth that is less than a depth of the first well.

20. The method of claim 19, further comprising forming first and second channel regions of opposite conductivity type within the respective first and second wells using the single patterned layer.

* * * * *